United States Patent
Park et al.

(10) Patent No.: US 9,209,145 B2
(45) Date of Patent: Dec. 8, 2015

(54) SEMICONDUCTOR MEMORY DEVICE HAVING PADS

(71) Applicant: SK hynix Inc., Icheon-si Gyeonggi-do (KR)

(72) Inventors: Chang Kun Park, Gyeonggi-do (KR); Seong Hwi Song, Gyeonggi-do (KR); Yong Ju Kim, Gyeonggi-do (KR); Sung Woo Han, Gyeonggi-do (KR); Hee Woong Song, Gyeonggi-do (KR); Ic Su Oh, Gyeonggi-do (KR); Hyung Soo Kim, Gyeonggi-do (KR); Tae Jin Hwang, Gyeonggi-do (KR); Hae Rang Choi, Gyeonggi-do (KR); Ji Wang Lee, Gyeonggi-do (KR); Jae Min Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/550,445

(22) Filed: Nov. 21, 2014

(65) Prior Publication Data
US 2015/0076703 A1    Mar. 19, 2015

Related U.S. Application Data

(63) Continuation of application No. 12/493,617, filed on Jun. 29, 2009, now Pat. No. 8,916,975.

(30) Foreign Application Priority Data

Aug. 19, 2008    (KR) ........................ 10-2008-0080851

(51) Int. Cl.
*H01L 27/10* (2006.01)
*H01L 23/00* (2006.01)
*H01L 23/528* (2006.01)
*H01L 27/105* (2006.01)

(52) U.S. Cl.
CPC ............ *H01L 24/09* (2013.01); *H01L 23/5286* (2013.01); *H01L 24/06* (2013.01); *H01L 27/1052* (2013.01); *H01L 2224/061* (2013.01); *H01L 2224/06515* (2013.01); *H01L 2224/091* (2013.01); *H01L 2224/09515* (2013.01); *H01L 2924/1434* (2013.01); *H01L 2924/3011* (2013.01); *H01L 2924/30101* (2013.01)

(58) Field of Classification Search
CPC ................. H01L 2924/14; H01L 2924/01079; H01L 2924/01013; H01L 2924/01029; H01L 2924/01078; H01L 27/1052
USPC .......................................... 257/773
See application file for complete search history.

(56) References Cited

U.S. PATENT DOCUMENTS 7,623,398 B2 * 11/2009 Arai .............................. 365/194

* cited by examiner

*Primary Examiner* — Monica D Harrison
(74) *Attorney, Agent, or Firm* — William Park & Associates Ltd.

(57) ABSTRACT

A semiconductor memory device includes a semiconductor circuit substrate having a chip pad forming region. A pair of data lines are formed on the semiconductor circuit substrate at one side of the chip pad region. The pair of data lines extend along a direction that the chip pad region of the semiconductor circuit substrate extends. The pair of data lines are arranged to be adjacent to each other and receive a pair of differential data signals. A power supply line is formed on the semiconductor circuit substrate at the other side of the chip pad region. The power supply line extends along the direction that the chip pad region of the semiconductor circuit substrate extends, and the power supply line receives power.

7 Claims, 3 Drawing Sheets

SEMICONDUCTOR MEMORY DEVICE HAVING PADS

CROSS-REFERENCES TO RELATED PATENT APPLICATION

This application is a Continuation of U.S. application Ser. No. 12/493,617, filed Jun. 29, 2009, to be issued on Dec. 23, 2014 as U.S. Pat. No. 8,916,975, the specification of which is incorporated herein by reference.

BACKGROUND

1. Technical Field

The present invention relates generally to a semiconductor memory device, and more particularly, to a semiconductor memory apparatus having pads.

2. Related Art

Generally, differential signaling is used in the transmission of data between a high-speed circuit and a high-speed interface, that is, a central processing unit (CPU), a controller, a system interface, etc. In differential signaling, information is transmitted electronically using a differential signal composed of two complementary signals, for example, a positive signal (hereinafter, designated as a "+" signal) and a negative signal (hereinafter, designated as a "−" signal). In greater detail, the "−" signal of the differential signal is designed and generated to have a reverse phase of the "+" signal level. Therefore, even when a positive signal having a low level is applied, data signals that are stable can be transmitted by the difference between the positive signal and the negative signal having the reverse phase thereto. With this in mind, it can be understood that accurately maintaining a cross point of output voltage 'Vox' between the differential signals is an important factor to maintain the differential characteristics of the signal. Differential signal lines carrying the complementary signals are connected to chip pads. To support an accurate cross point, the chip pads (i.e., differential signal pads) and differential signal lines connected to the differential signal pads are arranged adjacent to each other so that the distance between the chip pads and the signal lines is substantially the same. This arrangement helps to reduce mis-matching between the signals.

Meanwhile, high speed transmission in a semiconductor device requires an increased operation frequency, which in turn leads to increased power consumption. As a consequence, a larger number of external supply power pads and ground power pads are provided to stably supply power.

In this case, the arrangement of the pads applied with the differential signals and the power pads is very important in the high-speed operation circuit. For example, when a connection line between the pad applied with the positive signal and an external supply power pad is longer than a connection line between the pad applied with the negative signal and an external supply power pad, the effective termination resistance 'RTTeff' becomes mismatched. Therefore, even if the positive signal line and the negative signal line are disposed to be adjacent to each other on the semiconductor circuit substrate, the cross point of the output voltage between the positive signal and the negative signal can change due to a mismatch of the effective termination resistor. Consequently, a mis-matching phenomenon between the positive and negative signals can occur.

SUMMARY

Various embodiments of the present invention include a semiconductor memory apparatus capable of reducing a signal mismatch between a pair of differential signals.

According to one aspect, a semiconductor memory device according to one embodiment is configured to include: a semiconductor circuit substrate; a pair of data lines that are formed on one side along a vertical direction to an extended direction of the semiconductor circuit substrate and are disposed to be adjacent to each other to receive a pair of differential data signals; and a power supply line that is formed on the other side along the vertical direction to the extended direction of the semiconductor circuit substrate and are disposed to receive power.

According to another aspect, a semiconductor memory device according to another embodiment is configured to include: a semiconductor circuit substrate; and a chip pad region included in the semiconductor circuit substrate, wherein the chip pad region includes a first differential signal data pad that is connected to a first pull up circuit unit and a first pull down circuit unit; a second differential signal data pad that is connected to a second pull up circuit unit and a second pull down circuit unit; and a power pad that is interposed between the first and second differential signal data pads.

These and other features, aspects, and embodiments are described below in the "Detailed Description."

BRIEF DESCRIPTION OF THE DRAWINGS

Features, aspects, and embodiments are described in conjunction with the attached drawings, in which.

DETAILED DESCRIPTION

According to an embodiment of the present invention, differential signal pads and power pads are disposed at a predetermined distance to prevent the mismatch of effective termination resistance for the differential signal pads. In other words, either the ground power supply or the external supply power pad is interposed between the differential signal pads, and each of the power pads of the remaining ground power supply or external supply are disposed at an outer side of one of the differential signal pads. At the same time, the lines electrically connected to the interposed power pad are disposed at a side of the chip pad region other than the side at which data lines connected to the differential signals so that the power line does not interpose between the data lines connected to the differential signals, thereby minimizing the signal distortion of the data lines associated with the differential signals or the effect from other signal lines. Thus, differential signals reducing the mismatch between the signals can be provided.

Hereinafter, a semiconductor integrated circuit according to an embodiment of the present invention will be described with reference to the accompanying drawings.

Figure 1:
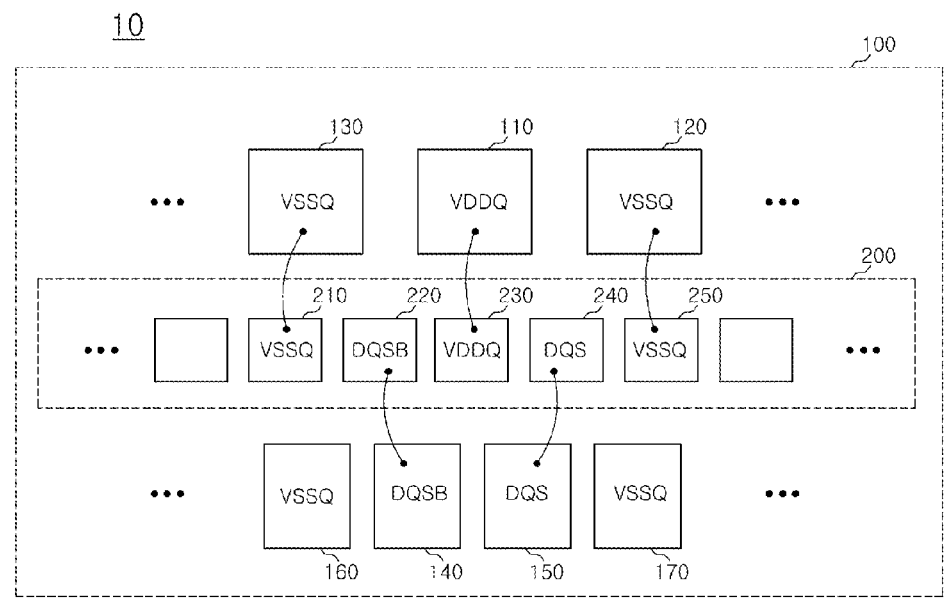
FIG. 1 is a block layout diagram showing a layout of a semiconductor memory device according to an embodiment of the present invention.

FIG. 1 is a block layout diagram of a semiconductor memory device according to one embodiment.

Referring now to FIG. 1, a semiconductor memory device 10 according to an embodiment includes a semiconductor circuit substrate 100 on which apertures are provided and a chip pad region 200 comprising a plurality of pads formed in the apertures.

An external supply power signal line 110, ground power signal lines 120 and 130, a pair of data lines 140 and 150, and extra ground power signal lines 160 and 170 are disposed on the semiconductor circuit substrate 100. In an embodiment of the present invention, the external supply power signal line 110 and the ground power signal lines 120 and 130 are disposed on an upper row on the basis of the chip pad region 200. Further the pair of data lines 140 and 150, and the extra ground power signal lines 160 and 170 are disposed on a lower row on the basis of the chip pad region 200 (i.e. each is arranged to extend in a direction on the semiconductor circuit substrate 100 at a side of the chip pad region 200).

The chip pad region 200 includes a first ground power pad 210, a first differential signal pad 220, an external supply power pad 230, a second differential signal pad 240, and a second ground power pad 250.

The external supply power pad 230 is arranged to be interposed between the first differential signal pad 220 and the second differential signal pad 240 that together receive a differential signal that includes complementary signals. The first differential signal pad 220 and the second differential signal pad 240 receive respectively signals having a phase that is inverted with respect to each other.

The first differential signal pad 220 and the second differential signal pad 240 are electrically connected to the first and second data lines 140 and 150, respectively, on the semiconductor circuit substrate 100. In this case, according to an embodiment, the first and second data lines 140 and 150 are disposed on the lower row along a direction to an extended direction of the semiconductor circuit substrate 100. Further, the first and second data lines 140 and 150 are arranged in parallel so as to be adjacent to each other. As such, when the first differential signal pad 220 and the second differential signal pad 240 receive a pair of differential data, the mismatch between the signals can be reduced when compared to conventional arrangements.

Meanwhile, the external supply power pad 230 faces the first and second data lines 140 and 150 and is electrically connected to the external supply power line 110 that is disposed at the side opposite to the side (i.e, upper row vs. lower row) at which the first and second data lines 140 and 150 are formed. According to an embodiment, the external supply power pad 230 is arranged to be interposed between the first differential signal pad 220 and the second differential signal pad 240. Further, an embodiment of the present invention makes it possible to obtain symmetry with respect to a line dividing the semiconductor circuit substrate 100 at the midpoint of the external supply power pad for the external power supply signal line, the external supply power pad electrically connected to the external power supply signal line 110, the first and second differential signal pads 220 and 240, and the pair of data lines 140 and 150. Accordingly, in the embodiment of the present invention shown in FIG. 1, the effect of the effective termination resistance between the first differential signal pad 220 and the external supply power pad 230 and the effect of effective termination resistance between the second differential signal pad 240 and the external supply power pad 230 can be controlled to be substantially the same.

Alternatively, the extra ground power lines 160 and 170 may be electrically connected to the ground power pads 210 and 250, respectively, instead of the first and second ground power lines 130 and 140. However, it is preferable that the extra ground power lines 160 and 170 are in a state in which they are not electrically connected to any signal pads and are instead used for shielding a signal so that the first and second data lines 140 and 150 are not affected by other signals.

Similarly, the first and second ground power pads 210 and 250 are arranged at the outer side of the first differential signal pad 220 and the second differential signal pad 240, respectively, with the outer side being opposite to the side at which the external supply power pad 230 is formed. For example, each of the first and second differential signal pads 220 and 240 is interposed between the respective ground power pad 210, 250 and the external supply power pad. Accordingly, embodiments of the present invention also make it possible to obtain symmetry with respect to the ground supply signal lines 120 and 130 and the first and second ground power pads 210 and 250. Accordingly, the effect of the effective termination resistance between the first differential signal pad 220 and the ground power pad 210 and the effect of the effective termination resistance between the second differential signal pad 240 and the ground power pad 250 can be controlled to be substantially the same.

Figure 2:
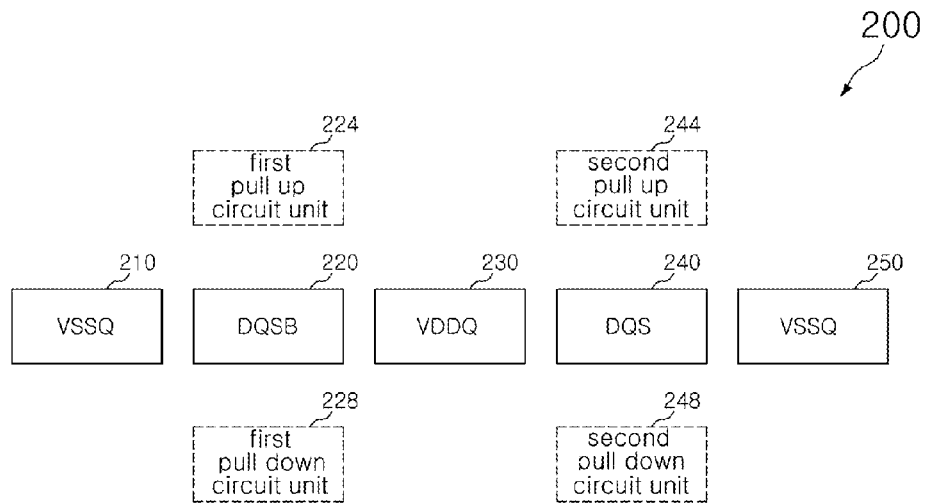
FIG. 2 is a conceptual block diagram of a chip pad region and a circuit unit shown in FIG. 1 according to an embodiment of the present invention.
Figure 3:
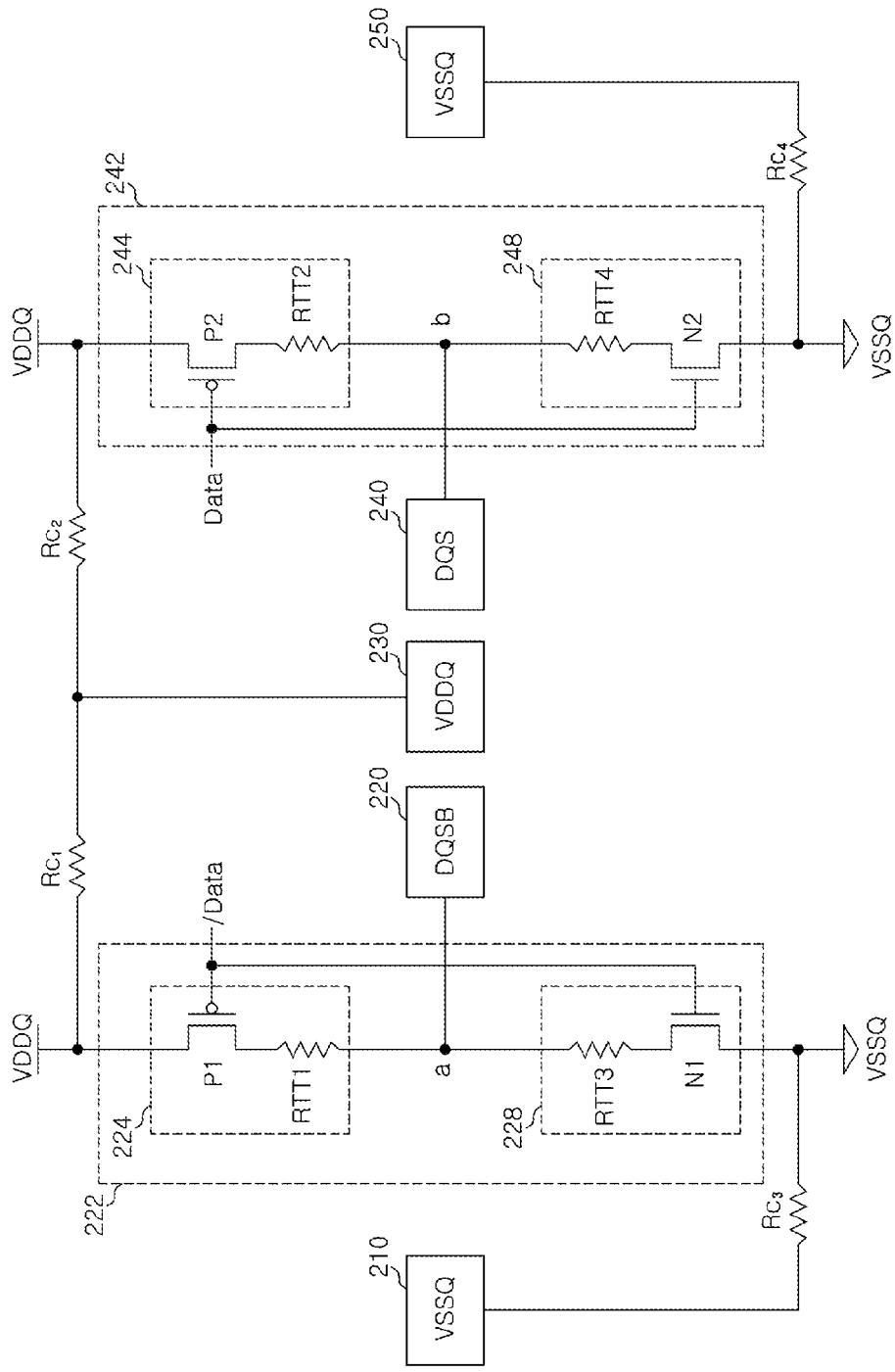
FIG. 3 is an equivalent circuit diagram of the chip pad region and the circuit unit shown in FIG. 2 according to an embodiment of the present invention.

FIG. 2 is a conceptual block diagram of the chip pad region 200 shown in FIG. 1 according to an embodiment of the present invention, and FIG. 3 is a circuit diagram of the chip pad region and the circuit unit shown in FIG. 2 according to an embodiment of the present invention.

Referring to FIGS. 2 and 3, a first circuit unit 222 and a second circuit unit 242 are electrically connected to the first differential signal pad 220 and the second differential signal pad, respectively. The first circuit unit 222 comprises a first pull-up unit 224 and a first pull-down unit 228, and the second circuit unit 242 comprises a second pull-up unit 244 and a second pull-down unit 248. The first differential signal pad 220 is electrically connected to the first pull up circuit unit 224 and the first pull down circuit unit 228 at node a. The second differential signal pad 240 is electrically connected to the second pull up circuit unit 244 and the second pull down circuit unit 248 at node b.

The first pull up circuit unit 224 is configured to include a first PMOS transistor 'P1' and a first termination resistor 'RTT1'. The first PMOS transistor 'P1' is configured such that its gate receives a negative data signal '/Data', its source receives external supply power 'VDDQ', and its drain is electrically connected to the first termination resistor 'RTT1'.

The first pull down circuit unit 228 is configured to include a first NMOS transistor 'N1' and a third termination resistor 'RTT3'. The first NMOS transistor 'N1' is configured such that its gate receives the negative data signal '/Data' and performs a pull-down operation when the negative signal is high level, its source receives ground power 'VSSQ', and its drain is electrically connected to the third termination resistor 'RTT3'.

Meanwhile, the second pull up circuit unit 244 is configured to include a second PMOS transistor 'P2' and a second termination resistor 'RTT2'. The second PMOS transistor 'P2' is configured such that its gate receives a positive data signal 'Data', its source receives external supply power 'VDDQ', and its drain is electrically connected to the second termination resistor 'RTT2'.

The second pull down circuit unit 248 is configured to include a second NMOS transistor 'N2' and a fourth termination resistor 'RTT4'. The second NMOS transistor 'N2' is configured such that its gate receives the positive data signal 'Data' and performs a pull-down operation when the positive data signal 'Data' is a high level, its source receives ground power 'VSSQ', and its drain is electrically connected to the fourth termination resistor 'RTT4'.

A case in which the positive data signal 'Data' is a high level will now be described. At this time, the negative data signal '/Data' having an inverted phase of the positive data signal 'Data' is a low level.

Therefore, the first pull up and pull down circuit units 224 and 228 receive the negative data signal '/Data' having a low level, such that the first PMOS transistor 'P1' is turned-on and the first NMOS transistor 'N1' is turned off. Therefore, a voltage level of a common node 'a' becomes a voltage dropped level by the first termination resistor 'RTT1'. At this time, the second pull up and pull down circuit units 244 and 248 receive the positive data signal 'Data' having a high level, such that the second NMOS transistor 'N2' is turned-on and the second PMOS transistor P2 is turned off. Therefore, a voltage level of a common node 'b' becomes a voltage raised level by the fourth termination resistor 'RTT4'. Thereby, differential signals whose level is controlled and complimentary with respect to each other can be supplied to the first and second differential signal pads 220 and 240. As one example for termination resistances, the first to fourth termination resistors 'RTT1 to RTT4', which are termination resistors provided for matching the impedance between the first and second data lines 140 and 150, are illustrated as 34Ω. However, it should be understood that the termination resistors are not limited to this resistance.

A case in which the positive data signal 'Data' is at a low level will now be described.

In this case, the negative data signal '/Data' supplied to the gates of the first pull up and pull down circuit units 224 and 228 is at a high level, such that the first NMOS transistor 'N1' is turned-on and the PMOS transistor P1 is turned off. Therefore, a voltage level of the common node 'a' becomes a voltage raised level by the third termination resistor 'RTT3'.

In this case, the positive data signal 'Data' supplied to the gates of the second pull up and pull down circuit units 244 and 248 is at a low level, such that the second PMOS transistor 'P2' is turned-on and the second NMOS transistor N2 is turned off. Therefore, a voltage level of the common node 'b' becomes a voltage dropped level by the second termination resistor 'RTT2'.

Meanwhile, as shown in FIG. 3, first and second parasitic resistances 'Rc1 and Rc2' occur between the respective pull up circuit units 224 and 244 and the external supply power pad 230. Third and fourth parasitic resistance 'Rc3 and Rc4' also occur between the respective pull down circuit units 228 and 248 and the ground power pads 210 and 250, which are adjacent to each other. Herein, the first to fourth parasitic resistances 'Rc1 to Rc4' are illustrated as about 1Ω, for example.

Therefore, the effective termination resistance 'RTTeff' from the first pull up circuit unit 224 of the first differential signal pad 220 to the external supply power pad 230 is 35Ω (=RTT1+Rc1) when the example resistances of above are used. Further, the effective termination resistance 'RTTeff' from the second pull up circuit unit 244 of the second differential signal pad 240 to the external supply power pad 230 is also 35Ω (=RTT2+Rc2) when the example resistance of above are used.

Similarly, the effective termination resistance 'RTTeff' from the first pull up circuit unit 228 of the first differential signal pad 220 to the first ground power pad 210 is 35Ω (=RTT3+Rc3) when the example references of above are used. Further, the effective termination resistance 'RTTeff' from the second pull up circuit unit 244 of the second differential signal pad 240 to the external supply power pad 230 is also 35Ω (=RTT4+Rc4) when the example references of above are used.

Accordingly, due to the configuration shown in FIGS. 1-3, in which the external supply power pad 230 is interposed between the first and second differential signal pads 220 and 240, the arrangement distance between each of the first and the second pull up circuit units 224, 244 and the external supply power pad 220 is uniform, such that the effective termination resistance is the same. That is, the distance (connection line) over which the electrical connection between the external supply power pad 230 and the first differential signal pad 220 is made can be uniform with the distance (connection line) over which the electrical connection between the external supply power pad 230 and the second differential signal pad 240 is made, so that the effective termination resistances 'RTTeff' can be controlled to be the same.

Further, the ground power pads 210 and 250 are disposed to be adjacent to the first pull down circuit unit 228 and the second pull down circuit unit 248 respectively, such that the effective termination resistance between each of the pull down circuit units 228 and 248 and the ground power pads 210 and 250 can be controlled to be the same. Accordingly, when the first and second ground pads 210 and 250 are configured as shown in FIGS. 1-3, the distance (connection line) over which electrical connection between the first ground pad 210 and the first differential signal pad 220 is made can be uniform with the distance (connection line) over which electrical connection between the second ground pad 250 and the second differential signal pad 240 is made.

Figure 4:
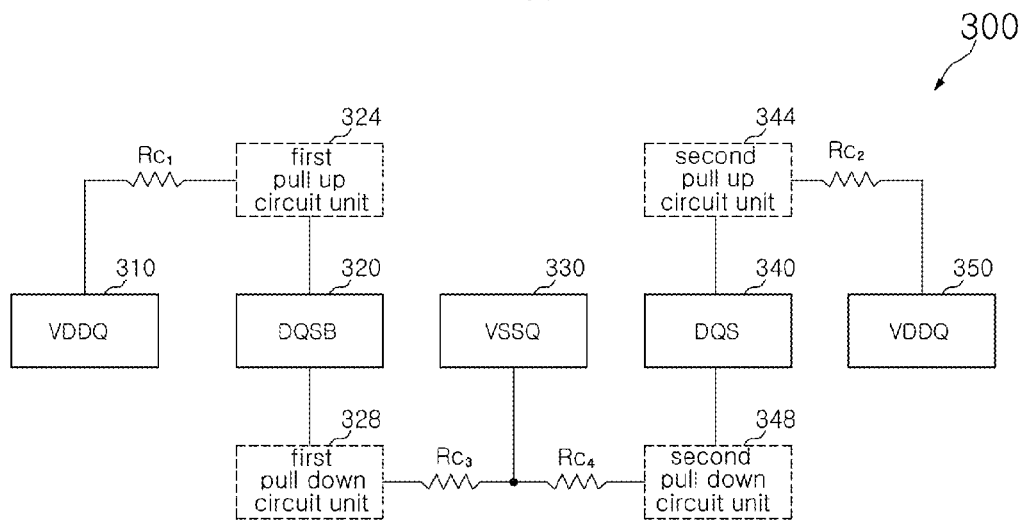
FIG. 4 is a conceptual block diagram of a semiconductor memory device according to another embodiment of the present invention.

FIG. 4 shows a conceptual block diagram of a chip pad region 300 according to another embodiment of the present invention.

In FIG. 4, only the differences from the previous embodiments will be described in detail.

Referring to FIG. 4, first and second pull down circuit units 328 and 348 are electrically connected to first and second differential signal pads 320 and 340, and a ground power pad 330 is interposed between the first and second differential signal pads 320 and 340 and is electrically connected to a node connected between both the first pull down circuit unit 328 and the second pull down circuit unit 348. Although not shown, each of the pull down circuit units 328 and 348 includes termination resistors each having the same predetermined resistance value (refer, e.g., to FIG. 3). As shown in FIG. 4, third and fourth parasitic resistances 'Rc3 and Rc4' occur between the first pull down circuit unit 328 and the ground pad and between the second pull down circuit unit 348 and the ground power pad 330, respectively. With the configuration shown in FIG. 4, the parasitic resistance between the respective pull down circuit units 328 and 348 and the ground power pad 330 may be substantially the same. Accordingly, the distance (connection line) over which the electrical connection between the ground power pad 330 and the first differential signal pad 320 is made can be uniform with the distance (connection line) over which the electrical connection between the ground power pad 330 and the second differential signal pad 340 is made, so that the effective termination resistances 'RTTeff' can be controlled to be the same.

Meanwhile, the external supply power pads 310 and 350 are disposed to be adjacent to the pull up circuit units 324 and 344, respectively so as to control the arrangement distance to be the same. Each of the pull up circuit units 324 and 344 includes a termination resistor, and the termination resistors of the pull up circuit units 324 and 344 have the same resistance value. As shown in FIG. 4, first and second parasitic resistances 'Rc1 and Rc2' occur between the pull up circuit units 324 and 344 and the external supply power pads 310 and 350 that are disposed to be adjacent to the pull up circuit units 324 and 344. Therefore, with the configuration shown in FIG. 4, the parasitic resistance between the pull down circuit units 328 and 348 and the external supply power pads 310 and 350 adjacent thereto may be substantially the same. Accordingly, when the first and second external supply power pads 310 and 350 are configured as shown in FIG. 4, the distance (connection line) over which electrical connection between the first external supply pad 310 and the first differential signal pad 320 is made can be uniform with the distance (connection line) over which electrical connection between the second external supply pad 350 and the second differential signal pad 340 is made.

Figure 5:
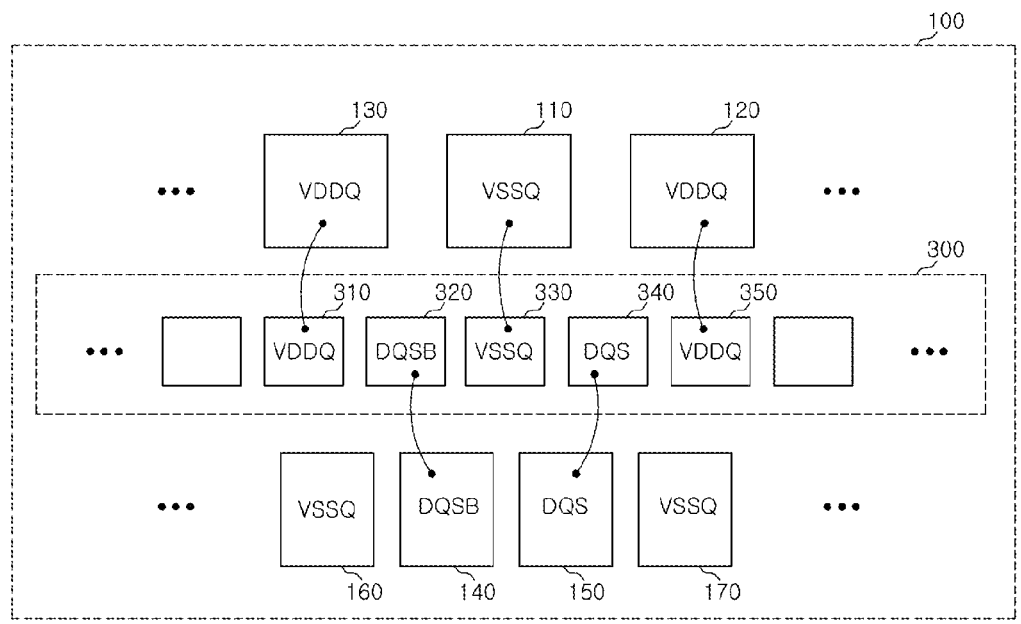
FIG. 5 is a block layout diagram showing a layout of a semiconductor device including the chip pad region and circuit unit of FIG. 4 according to an embodiment of the present invention.

FIG. 5 is a conceptual block layout diagram showing a semiconductor memory apparatus 10 having the chip pad region 300 shown in FIG. 4 according to an embodiment of the present invention.

As in the embodiment shown in and explained with reference to FIG. 1, the first and second data lines 140 and 150, which are differential signal data lines electrically connected to the first differential signal pad 320 and the second differential signal pad 340 respectively, are configured to receive a differential signal that includes complementary data signals and are arranged so that the first and second data lines 140 and 150 are parallel to each other as well as adjacent to each other (as previously described, the blocks designated as the first and second data lines 140 and 150 are disposed on the lower row along a direction to an extended direction of the semiconductor circuit substrate 100 on the basis of the chip pad region 300 shown in FIG. 5).

As shown in FIG. 5, the embodiment of the present invention shown in FIG. 5 is different from the embodiment shown in FIG. 1, in that the chip pad interposed between the first and second differential signal pads 320 and 340 is of a different kind of power supply. That is, the ground power pad 330 is interposed between the first differential signal pad 320 and the second differential signal pad 340. Further, the first external supply power pad 310 is disposed to be adjacent to the first differential signal pad 320 and the second external supply power pad 350 is disposed to be adjacent to the second differential signal pad 340.

In this case, it can be appreciated that the first and second external supply power pads 310 and 350 are electrically connected to the first and second external supply power lines 130 and 120, respectively. Further, it can be appreciated that the ground power pad 330 is electrically connected to the ground power line 110.

Even in this case, similar to the embodiment shown in FIG. 1, the first and second differential signal data lines 140 and 150, which are electrically connected to the first and second differential signal data pads 320 and 340, are disposed to be adjacent to each other on any one of the upper and lower rows (sides) of the chip pad region (i.e., when viewed from above as in FIG. 5, above or below the chip pad region 300). At the same time, the ground power line 110 is disposed to be opposite to the row of the chip pad region on which the first and second data lines 140 and 150 are disposed.

As described above, according to embodiments of the present invention, the differential signal pads are arranged to be a predetermined distance from the power supply pads to prevent mis-matching of the termination resistance of the differential signal pads. In other words, the ground power supply or the external supply power pad is interposed between the differential signal pads, and different kind of the power pads which interposed between the differential signal pads are disposed at the outer sides of the differential signal pad. At the same time, the line electrically connected to the interposed power pad is disposed on the opposite side of the chip pad region, so that the line electrically connected to the interposed power pad does not interpose between the data lines connected to the differential signals, thereby making it possible to minimize both signal distortion of the data line associated with the differential signal and the effect from other lines. Thus, differential signals lessening the mis-match between the signals can be provided.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor memory device, comprising:
a chip pad region comprising a first differential signal pad configured to receive a first differential data signal, a second differential signal pad configured to receive a second differential data signal having a level being opposite to a level of the first differential data signal, and a power pad configured to receive a voltage through a power signal line and interposed between the first and second differential signal pads,
wherein a first distance between the first differential signal pad and the power pad is substantially same with a second distance between the second differential signal pad and the power pad, to be equalized an effective termination resistor between the first differential signal pad and the power pad, with an effective termination resistor between the second differential signal pad and the power pad.

2. The semiconductor memory device of claim 1, further comprising a first and a second data lines formed at a first side with reference to the chip pad region,
wherein each of the first and the second data lines is arranged adjacent to each other and electrically connected to the first and the second differential signal pads respectively.

3. The semiconductor memory device of claim 2, wherein the power signal line formed at a second side with reference to the chip pad region and electrically connected to the power pad,
wherein the second side is opposite to the first side with reference to the chip pad region and the chip pad region is interposed between the first side and the second side.

4. The semiconductor memory device of claim 1, wherein the power pad is an external supply power pad, and the chip pad region further comprises a first and a second ground power pads each arranged at an outer side of the respective first and second differential signal pads, wherein distances from the first ground power pad to the first differential signal pad and from the second ground power pad to the second differential signal pad are substantially the same.

5. The semiconductor memory device of claim 1, wherein the power pad includes a ground power pad.

6. The semiconductor memory device of claim 5, wherein the chip pad region further comprises a first and a second external supply power pads each arranged at an outer side of the respective first and second differential signal pads.

7. The semiconductor memory device of claim 6, wherein distances from the first external supply power pad to the first differential signal pad and from the second external supply power pad to the second differential signal pad are substantially the same.

* * * * *